United States Patent
Park

(10) Patent No.: US 8,119,520 B2
(45) Date of Patent: Feb. 21, 2012

(54) SEMICONDUCTOR DEVICE AND METHOD FOR MANUFACTURING THE SAME

(75) Inventor: Kyung Min Park, Namdong-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 154 days.

(21) Appl. No.: 12/564,485

(22) Filed: Sep. 22, 2009

(65) Prior Publication Data

US 2010/0003815 A1   Jan. 7, 2010

Related U.S. Application Data

(62) Division of application No. 11/777,063, filed on Jul. 12, 2007, now abandoned.

(30) Foreign Application Priority Data

Jul. 12, 2006 (KR) .................. 10-2006-0065592

(51) Int. Cl.
*H01L 21/28* (2006.01)

(52) U.S. Cl. ....................................... 438/627; 257/767

(58) Field of Classification Search .................. 438/627, 438/628, 642–644, 652–654, 685, 687
See application file for complete search history.

(56) References Cited

U.S. PATENT DOCUMENTS

| 6,683,002 B1* | 1/2004 | Chooi et al. | .................. 438/687 |
| 2002/0182385 A1* | 12/2002 | Senkevich et al. | ............ 428/209 |
| 2004/0092096 A1* | 5/2004 | Raaijmakers et al. | ........ 438/627 |

FOREIGN PATENT DOCUMENTS

KR   10-2001-0032474   12/2002
KR   10-2002-0042274   1/2004

* cited by examiner

*Primary Examiner* — Kiesha Bryant
*Assistant Examiner* — Mark Tornow
(74) *Attorney, Agent, or Firm* — Saliwanchik, Lloyd & Eisenschenk

(57) ABSTRACT

A semiconductor device and method for manufacturing the same is provided, capable of gap-filling a copper metal wiring while minimizing void generation. A semiconductor device according to an embodiment includes a copper sulfide layer formed on a first barrier metal formed in a via and trench; and a via plug and an upper metal wiring formed in the via hole and the trench, respectively, on the copper sulfide layer and an exposed lower metal wiring.

9 Claims, 3 Drawing Sheets

SEMICONDUCTOR DEVICE AND METHOD FOR MANUFACTURING THE SAME

CROSS-REFERENCE TO RELATED APPLICATIONS

This application is a divisional of U.S. application Ser. No. 11/777,063, filed Jul. 12, 2007 now abandoned, which claims the benefit under 35 U.S.C. §119 of Korean Patent Application No. 10-2006-0065592, filed Jul. 12, 2006, which are hereby incorporated by reference in their entirety.

BACKGROUND

Generally, a metal wiring is used for connecting between devices or between wirings in manufacturing a semiconductor device.

A dual damascene process uses a barrier metal for preventing copper from diffusing into an interlayer dielectric layer, and uses a copper seed layer for easily coating the copper.

However, as the degree of integration of the semiconductor device is increased, the deposition of the copper seed layer is restricted so that the copper seed layer is not uniformly formed on the barrier metal.

Therefore, the copper is not coated well in a process of forming a via plug and an upper metal wiring which is the subsequent process so that a void occurs between the interlayer dielectric layer, the metal wiring, and the via plug, thereby degrading the characteristics of the semiconductor device.

BRIEF SUMMARY

Embodiments of the present invention provide a semiconductor device and a method for manufacturing the same capable of gap-filling a copper metal wiring without generating a void even when there is not a copper seed layer.

A semiconductor device according to an embodiment includes: a first interlayer dielectric layer including a predetermined via hole; a second interlayer dielectric layer formed on the first interlayer dielectric layer and including a predetermined trench in contact with the via hole of the first interlayer dielectric layer; a first barrier metal formed on the first interlayer dielectric layer and the second interlayer dielectric layer on the via hole and the trench; a copper sulfide layer formed on the first barrier metal; and a via plug and an upper metal wiring formed on the copper sulfide layer in the via hole and the trench, respectively.

Further, a method for manufacturing a semiconductor device according to an embodiment comprises: forming a via hole and a trench, respectively, by etching a first interlayer dielectric layer and a second interlayer dielectric layer; forming a first barrier metal on the etched first interlayer dielectric layer and second interlayer dielectric layer; and forming a sulfur monolayer on the first barrier metal.

DETAILED DESCRIPTION

Hereinafter, a semiconductor device and a method for manufacturing the same according to embodiments of the present invention will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
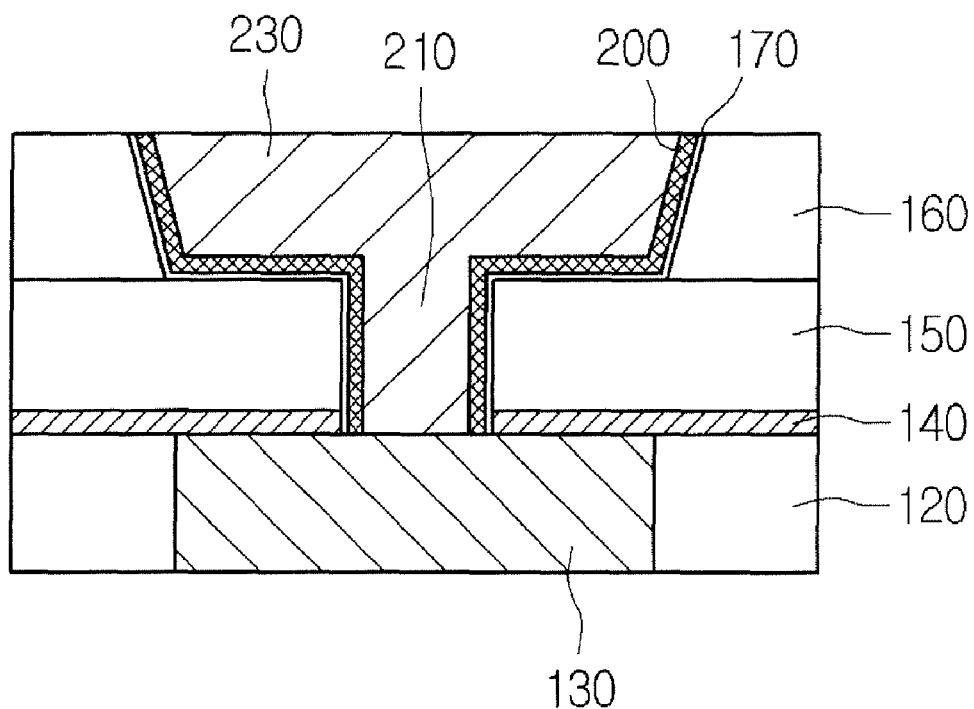
FIG. 1 is a cross-sectional view of a semiconductor device according to an embodiment.

FIG. 1 is a cross-sectional view of a semiconductor device according to an embodiment.

The semiconductor device according to an embodiment can include a lower interlayer dielectric layer 120, a capping film 140, a first interlayer dielectric layer 150, a second interlayer dielectric layer 160, a first barrier metal 170, a copper sulfide layer 200 formed on the first barrier metal 170, a via plug 210, and an upper metal wiring 230.

The lower interlayer dielectric layer 120 can include a predetermined lower metal wiring 130. The lower metal wiring 130 can use any one of Cu, Al, Ag, Au, or W. The lower interlayer dielectric layer 120 can be formed of, for example, a TEOS-CVD, a plasma enhanced chemical vapor deposition (PECVD)-$SiO_2$, a PECVD-SiON, a BPSG using TEOS, a CVD-$SiO_2$ film doped using silane gas ($SiH_4$), or a CVD-PSG (phospho silicate glass) doped with phosphorus (P).

The capping film 140 can be formed on the lower metal wiring 130 while selectively exposing the lower metal wiring 130. The capping film 140 serves to prevent diffusion of metal for a metal wiring, and the capping film 140 inhibits the deterioration of the lower interlayer dielectric layer 120 caused by diffusing the metal for the metal wiring into the lower interlayer dielectric layer 120. At this time, the capping film 140 can be formed of SiN or other materials capable of blocking the diffusion of metal.

The first interlayer dielectric layer 150 can be formed on the capping film 140. The second interlayer dielectric layer 160 can be formed on the first interlayer dielectric layer 150. The first interlayer dielectric layer 150 includes predetermined via holes, and the second interlayer dielectric layer 160 includes predetermined trenches in contact with the predetermined via holes.

In a further embodiment, an anti-reflective film (not shown) can be formed between the first interlayer dielectric layer and the second interlayer dielectric layer 160, making it possible to easily form the via hole and the trench.

The first interlayer dielectric layer 150 and the second interlayer dielectric layer 160 can be formed of, for example, a plasma enhanced chemical vapor deposition (PECVD)-$SiO_2$, a PECVD-SiON, a BPSG using TEOS, a CVD-$SiO_2$ film doped using silane gas($SiH_4$), or a CVD-PSG(phospho silicate glass) doped with phosphorous (P).

The first barrier metal 170 can be formed on the first interlayer dielectric layer 150 and the second interlayer dielectric layer 160 along the surfaces of the via hole and the trench. In an embodiment, the first barrier metal 170 can be formed of TaN or TiN. The first barrier metal 170 can leave the top surface of the lower metal wiring 130 exposed.

A copper sulfide layer 200 can be formed on the first barrier metal 170.

The copper sulfide layer 200 can be formed as a second barrier metal 180 including sulfur (S) on the first barrier metal 170, which then forms a sulfur monolayer 190 through a thermal process of the second barrier metal 180. The second barrier metal 180 including sulfur can be formed using TaS or TiS as a metal target. The first barrier metal 170 and the second barrier metal 180 can be sequentially formed and then the second barrier metal 180 and the first barrier metal 170 can be etched to expose the lower metal wiring 130. Alternatively, the first barrier metal 170 can be formed and etched to expose the lower metal wiring 130, and then the second barrier metal 180 can be formed and etched to expose the lower metal wiring 130.

A via plug 210 and an upper metal wiring 230 can be formed by filling the via hole and the trench, respectively, with a metal layer on the sulfur monolayer 190 and the exposed lower metal wiring 130.

The copper sulfur monolayer($Cu_2S_4$) 200 forms by the contact of the sulfide layer 190 with copper, making it possible to gap fill a copper metal wiring 230 without generating a void even when there is no a copper seed layer.

With the semiconductor device according to an embodiment, $Cu_2S_4$ material is first created in the process of the copper metal wiring by segregating sulfur (S) element of the second barrier metal on a surface through a subsequent thermal processing and forming a sulfur monolayer on the surface, making it possible to gap fill a copper metal wiring without generating a void even when there is no a copper seed layer.

Hereinafter, a method for manufacturing a semiconductor device will be described below with reference to the accompanying drawings.

FIGS. 2 to 5 are cross-sectional views of a fabricating process of a semiconductor device according to an embodiment.

A method for manufacturing a semiconductor device according to an embodiment can include: forming a via hole and a trench in interlayer dielectric layers; exposing a lower metal wiring formed below the interlayer dielectric layers; forming a first barrier metal and a second barrier metal in the via hole and the trench; forming a sulfur monolayer; and forming a via plug and an upper metal wiring.

Figure 2:
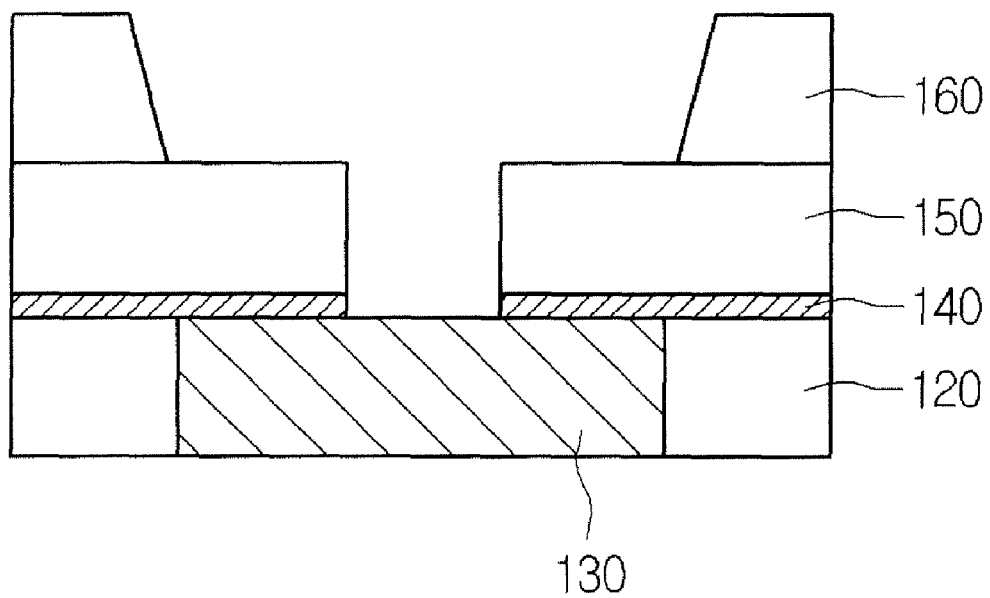
FIGS. 2 to 5 are cross-sectional views of a fabricating process of a semiconductor device according to an embodiment.

Referring to FIG. 2, the device can include a lower metal wiring 130, a capping film 140 formed on the lower metal wiring, and a first interlayer dielectric layer 150 and a second interlayer dielectric layer 160 sequentially formed on the capping film 140.

The via hole and the trench can be formed by etching the first interlayer dielectric layer 150 and the second interlayer dielectric layer 160.

The first interlayer dielectric layer 150 and the second interlayer dielectric layer 160 can be formed of, for example, a plasma enhanced chemical vapor deposition (PECVD)-$SiO_2$, a PECVD-SiON, a BPSG using TEOS, a CVD-$SiO_2$ film doped using silane gas($SiH_4$), or a CVD-PSG(phospho silicate glass) doped with phosphorous (P).

The process of forming the via hole and the trench can be progressed by means of a via first method where the via hole is formed first, for example through both the second interlayer dielectric layer 160 and the first interlayer dielectric layer 150; or a trench first method where the trench is formed first and then the via hole is formed in the first interlayer dielectric layer 150.

Next, a part of the lower metal wiring 130 can be exposed by etching the capping film 140 in the via hole area.

However, in one embodiment, the step of exposing the lower metal wiring can be progressed after forming the sulfur monolayer 190.

Figure 3:
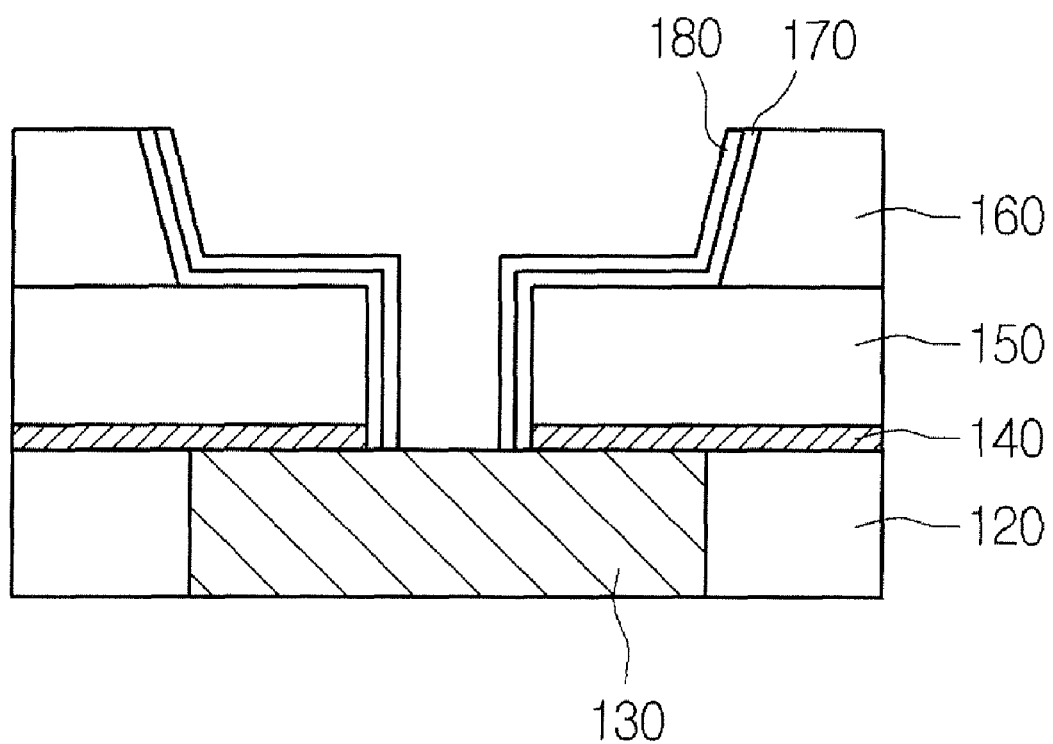

Referring to FIG. 3, the first barrier metal 170 and the second barrier metal 180 including sulfur (S) can be sequentially formed on the etched first interlayer dielectric layer 150 and the second interlayer dielectric layer 160. The first barrier metal 170 and the second barrier metal 180 can be sequentially formed and then the second barrier metal 180 and the first barrier metal 170 can be etched to expose the lower metal wiring 130. Alternatively, the first barrier metal 170 can be formed and etched to expose the lower metal wiring 130, and then the second barrier metal 180 can be formed and etched to expose the lower metal wiring 130.

The first barrier metal 170 can be formed on the first interlayer dielectric layer 150 and the second interlayer dielectric layer 160 in the via hole and the trench. The lower metal wiring 130 is exposed through the first barrier metal layer 170.

The second barrier metal 180 can be formed using metal including sulfur (S).

For example, an embodiment can use TaN/TaS or TiN/TiS as a combination for the first barrier metal 170 and the second barrier metal 180.

At this time, the first barrier metal 170 is formed between the interlayer dielectric layers 150 and 160 and the second barrier metal 180 in order to improve adhesion of the second barrier metal 180.

Also, the second barrier metal 180 includes an amorphous second barrier metal to further inhibit Cu from being diffused and entered into the material of the first interlayer dielectric layer 150 and the second interlayer dielectric layer 160.

In an embodiment, the second barrier metal 180 can be formed of TaS or TiS including a small quantity (1~4 wt %) of S.

Figure 4:
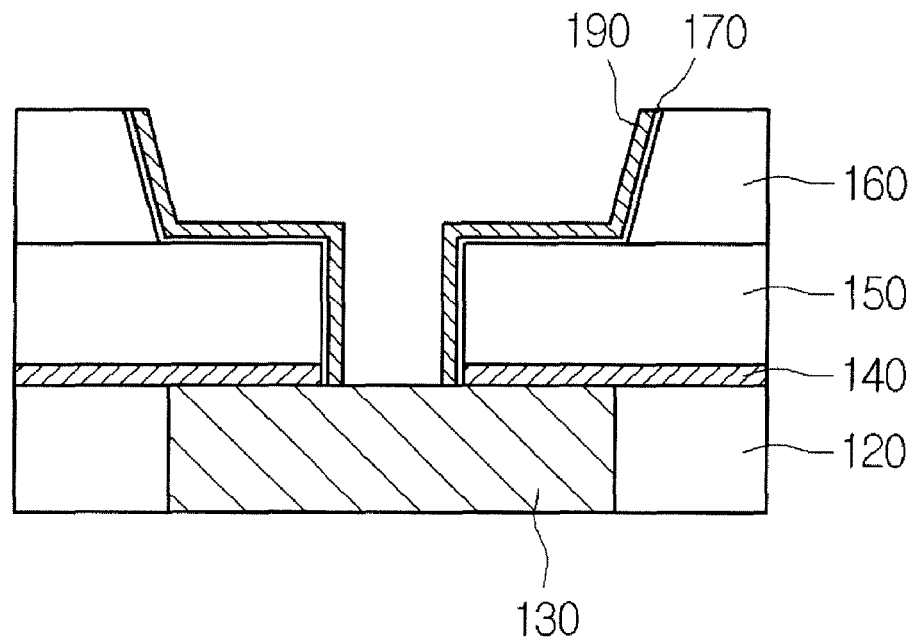
Figure 5:
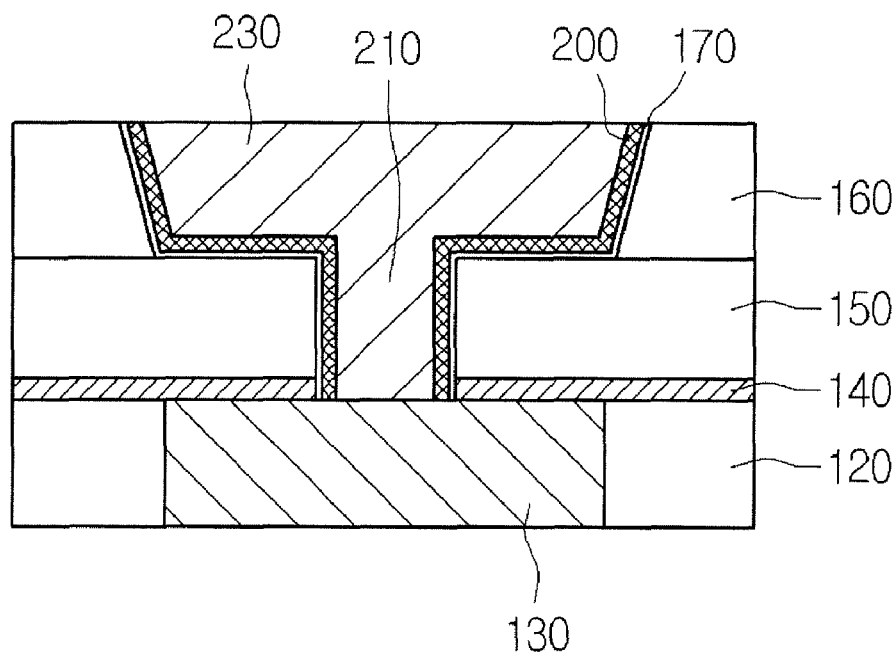

Next, referring to FIG. 4, forming the sulfur monolayer 190 on the first barrier metal 170 can be performed by thermally processing the second barrier metal 180.

The thermal process of the second barrier metal 180 can be performed at about 100° C. to about 300° C.

A reason that the thermal processing temperature is about 100° C. or more is to provide a temperature suitable to form the sulfur monolayer by applying driving power to the sulfur (S) of the second barrier metal 180 to be out-diffused into the surface. Hereinafter, the meaning of "about" indicates a tolerance of about (+/−) 10%.

A reason that the temperature is about 300° C. or less is because when the temperature exceeds 330° C., the transistor in a front-end-of-line (FELO) or Cu in a back-end-of-line (BELO) may be diffused and progressed into the interlayer dielectric layers 150 and 160. Therefore, the temperature limitation helps inhibit diffusion.

Also, the step of thermally processing the second barrier metal can be performed for about 1 to 120 minutes.

In an embodiment, as the thermal processing time of the second barrier metal 180 becomes shorter, good results can be obtained. However, in order to apply the driving power to the sulfur, the time can be restricted on the order of 120 minutes.

The via plug 210 and the upper metal wiring 230 can be formed in the via hole and the trench, respectively, on the sulfur monolayer 190 and the exposed lower metal wiring 130.

The copper sulfide layer ($Cu_2S_4$) 200 forms by the contact of the sulfide layer 190 with copper, making it possible to gap fill a copper metal wiring 230 without generating a void even when there is no a copper seed layer.

As described above, with the method for manufacturing the semiconductor device according to an embodiment, $Cu_2S_4$ material first formed in the process of the copper metal wiring by segregating sulfur (S) element of TaS or TiS, which can be the material of the second barrier metal, on a surface through a subsequent thermal processing to form a sulfur monolayer on the surface, making it possible to gap fill a copper metal wiring without generating a void even when there is no a copper seed layer.

Also, the process of the copper metal wiring can be progressed without forming the copper seed layer so that the copper metal wiring void can be prevented in an integrated process of 90 nm or less, making it possible to improve the characteristics and reliability of the semiconductor device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a semiconductor device comprising:
   forming a via hole and a trench in contact with the via hole by etching a first interlayer dielectric layer and a second interlayer dielectric layer;
   forming a first barrier metal on the etched first interlayer dielectric layer and second interlayer dielectric layer;
   forming a second barrier metal comprising sulfur (S) on the first barrier metal;
   forming a sulfur monolayer by thermal processing the second barrier metal; and
   forming a copper sulfide layer by contact of a copper with the sulfur monolayer.

2. The method according to claim 1, further comprising:
   forming a capping film on a lower metal wiring, wherein the first interlayer dielectric layer and the second interlayer dielectric layer are sequentially formed on the capping film; and
   exposing the lower metal wiring by etching the capping film in the via hole area.

3. The method according to claim 1, wherein the forming of the copper sulfide layer comprises:
   forming a via plug and an upper metal wiring by filling the via hole and the trench with copper, thereby forming the copper sulfide layer by contact of the copper with the sulfur monolayer.

4. The method according to claim 1, wherein the first barrier metal comprises TaN and the second barrier metal comprises TaS.

5. The method according to claim 1, wherein the first barrier metal comprises TiN and the second barrier metal comprises TiS.

6. The method according to claim 1, wherein the second barrier metal comprises 1 wt % to 4 wt % of sulfur (S).

7. The method according to claim 1, wherein the second barrier metal is amorphous.

8. The method according to claim 1, wherein thermal processing the second barrier metal comprises performing the thermal processing at a temperature of about 100° C. to about 300° C.

9. The method according to claim 1, wherein thermal processing the second barrier metal comprises performing the thermal processing for about 1 minute to about 120 minutes.

* * * * *